US009221129B2

(12) United States Patent
Imamura et al.

(10) Patent No.: US 9,221,129 B2
(45) Date of Patent: Dec. 29, 2015

(54) SOLDER ALLOY, SOLDER PASTE, AND ELECTRONIC CIRCUIT BOARD

(71) Applicant: HARIMA CHEMICALS, INCORPORATED, Kakogawa (JP)

(72) Inventors: Yoji Imamura, Hyogo (JP); Kazuki Ikeda, Hyogo (JP); JinYu Piao, Hyogo (JP); Tadashi Takemoto, Ibaraki (JP)

(73) Assignee: HARIMA CHEMICALS, INCORPORATED, Hyogo (JP)

( * ) Notice: Subject to any disclaimer, the term of this patent is extended or adjusted under 35 U.S.C. 154(b) by 0 days.

(21) Appl. No.: 14/410,862

(22) PCT Filed: Jun. 25, 2013

(86) PCT No.: PCT/JP2013/067393
§ 371 (c)(1),
(2) Date: Dec. 23, 2014

(87) PCT Pub. No.: WO2014/003006
PCT Pub. Date: Jan. 3, 2014

(65) Prior Publication Data
US 2015/0136461 A1 May 21, 2015

(30) Foreign Application Priority Data

Jun. 29, 2012 (JP) .................................. 2012-147196
Feb. 18, 2013 (JP) .................................. 2013-029248

(51) Int. Cl.
H05K 1/09 (2006.01)
H05K 1/11 (2006.01)
H05K 7/10 (2006.01)
B23K 35/02 (2006.01)
B23K 1/00 (2006.01)
B23K 35/26 (2006.01)
C22C 13/00 (2006.01)
C22C 13/02 (2006.01)
H05K 3/34 (2006.01)
H05K 1/02 (2006.01)

(52) U.S. Cl.
CPC ............... *B23K 35/025* (2013.01); *B23K 1/00* (2013.01); *B23K 1/0016* (2013.01); *B23K 35/0244* (2013.01); *B23K 35/26* (2013.01); *B23K 35/262* (2013.01); *C22C 13/00* (2013.01); *C22C 13/02* (2013.01); *H05K 1/02* (2013.01); *H05K 3/3463* (2013.01); *H05K 3/3484* (2013.01); *H05K 2201/2081* (2013.01)

(58) Field of Classification Search
CPC ...... B23K 35/262; B23K 35/22; C22C 13/00; C22C 13/02; H05K 13/02; H05K 3/3463
USPC ........................... 174/256, 257, 263; 361/771
See application file for complete search history.

(56) References Cited

U.S. PATENT DOCUMENTS

| 5,980,822 | A | 11/1999 | Moon et al. |
| 2004/0262779 | A1 | 12/2004 | Amagai et al. |
| 2007/0036671 | A1 | 2/2007 | Albrecht et al. |
| 2008/0061117 | A1 | 3/2008 | Munekata et al. |
| 2008/0159904 | A1* | 7/2008 | Lewis .................... C22C 13/00 420/561 |
| 2008/0292492 | A1* | 11/2008 | Ingham .................... C22C 1/06 420/561 |
| 2009/0232696 | A1 | 9/2009 | Ohnishi et al. |
| 2010/0307823 | A1 | 12/2010 | Kawamata et al. |
| 2011/0120769 | A1 | 5/2011 | Sakatani et al. |
| 2012/0175020 | A1 | 7/2012 | Imamura et al. |

FOREIGN PATENT DOCUMENTS

| CN | 1195592 A | 10/1998 |
| CN | 1475327 A | 2/2004 |
| CN | 101058132 A | 10/2007 |
| CN | 101356293 A | 1/2009 |
| JP | 2004-141910 A | 5/2004 |
| JP | 2004-188453 A | 7/2004 |
| JP | 2004-261863 A | 9/2004 |
| JP | 2005-254298 A | 9/2005 |
| JP | 2006-524572 A | 11/2006 |
| JP | 4787384 B1 | 10/2011 |
| JP | 2011-251310 A | 12/2011 |
| TW | 592872 B | 6/2004 |
| WO | WO 2006/129713 A1 | 12/2006 |
| WO | WO 2007/081775 A2 | 7/2007 |
| WO | WO 2010/122764 A1 | 10/2010 |
| WO | WO 2011/102034 A1 | 8/2011 |

OTHER PUBLICATIONS

International Search Report (PCT/ISA/210) mailed on Sep. 10, 2013, by the Japanese Patent Office as the International Searching Authority for International Application No. PCT/JP2013/067393.
Written Opinion (PCT/ISA/237) mailed on Sep. 10, 2013, by the Japanese Patent Office as the International Searching Authority for International Application No. PCT/JP2013/067393.
International Search Report (PCT/ISA/210) mailed on Feb. 12, 2013, 2013, by the Japanese Patent Office as the International Searching Authority for International Application No. PCT/JP2012/079847.
Written Opinion (PCT/ISA/237) mailed on Feb. 12, 2013, by the Japanese Patent Office as the International Searching Authority for International Application No. PCT/JP2012/079847.
PCT International Preliminary Report on Patentability (IPRP) and Written Opinion issued on Jan. 8, 2015, in corresponding International Application No. PCT/JP2013/067393 (17 pages).

* cited by examiner

Primary Examiner — Sherman Ng
(74) Attorney, Agent, or Firm — Buchanan, Ingersoll & Rooney PC

(57) ABSTRACT

A solder alloy of a tin-silver-copper solder alloy, containing tin, silver, antimony, bismuth, copper, and nickel, and substantially does not contain germanium, relative to the total amount of the solder alloy, the silver content is more than 1.0 mass % and less than 1.2 mass %, the antimony content is 0.01 mass % or more and 10 mass % or less, and the bismuth content is 0.01 mass % or more and 3.0 mass % or less.

21 Claims, No Drawings

SOLDER ALLOY, SOLDER PASTE, AND ELECTRONIC CIRCUIT BOARD

TECHNICAL FIELD

The present invention relates to a solder alloy, a solder paste, and an electronic circuit board. In particular, the present invention relates to a tin-silver-copper solder alloy, a solder paste containing the solder alloy, and an electronic circuit board produced by using the solder paste.

BACKGROUND ART

Generally, in metal joints in electrical and electronic devices, solder joints using solder pastes are used, and for such a solder paste, conventionally, a solder alloy containing lead is used.

However, recently, it has been required to suppress lead usage in view of environmental burden, and therefore a solder alloy (lead-free solder alloy) containing no lead is under development.

For such a lead-free solder alloy, for example, a tin-copper alloy, a tin-silver-copper alloy, a tin-bismuth alloy, and a tin-zinc alloy have been well-known, and in particular, a tin-silver-copper alloy has been widely used because of its excellent strength.

Meanwhile, silver contained in tin-silver-copper alloys is very expensive, and therefore reduction in the silver content has been required in view of cost reduction. However, simply reducing the silver content may cause poor fatigue resistance (particularly cold thermal fatigue) and poor connection.

Furthermore, such a tin-silver-copper alloy has been required to have well-balanced strength and extensibility, and at the same time have a suitable melting point.

To meet such requirements, Patent Document 1 below has proposed, as a tin-silver-copper alloy with a reduced silver content, to be specific, a low silver solder alloy consisting of, for example, 0.05 to 2.0 mass % of silver, 1.0 mass % or less of copper, 3.0 mass % or less of antimony, 2.0 mass % or less of bismuth, 4.0 mass % or less of indium, 0.2 mass % or less of nickel, 0.1 mass % or less of germanium, 0.5 mass % or less of cobalt, and a remaining mass % of tin.

CITATION LIST

Patent Document

Patent Document 1: Publication of Japanese Patent No. 4787384

SUMMARY OF THE INVENTION

Problem to be Solved by the Invention

Meanwhile, for such a solder alloy, furthermore, improvement in wettability and suppression of voids (gaps) has been required. However, the above-described low silver solder alloy in Patent Document 1 may have insufficient wettability, and suppression of voids (gaps) may be insufficient.

An object of the present invention is to provide a solder alloy that allows for a reduced silver content and low costs, ensures excellent wettability, and furthermore, suppresses voids (gaps) generation; a solder paste containing the solder alloy; and an electronic circuit board produced by using the solder paste.

Means for Solving the Problem

A solder alloy in an aspect of the present invention contains tin, silver, antimony, bismuth, copper, and nickel, and substantially does not contain germanium, wherein relative to the total amount of the solder alloy, the silver content is more than 1.0 mass % and less than 1.2 mass %, the antimony content is 0.01 mass % or more and 10 mass % or less, and the bismuth content is 0.01 mass % or more and 3.0 mass % or less.

It is preferable that in the solder alloy, the antimony content relative to the total amount of the solder alloy is 0.01 mass % or more and less than 2.5 mass %, and the total of the antimony content and the bismuth content relative to the total amount of the solder alloy is 0.1 mass % or more and 4.2 mass % or less, and in such a case, it is preferable that the mass ratio (Bi/Sb) of the bismuth content relative to the antimony content is 0.5 or more and 300 or less.

It is preferable that the solder alloy further contains indium, and the indium content relative to the total amount of the solder alloy is 0.01 mass % or more and 0.1 mass % or less.

It is preferable that the solder alloy substantially does not contain indium, the antimony content relative to the total amount of the solder alloy is 4.0 mass % or more and 10 mass % or less, the total of the antimony content and the bismuth content relative to the total amount of the solder alloy is 4.2 mass % or more and 12 mass % or less, and in such a case, the mass ratio (Bi/Sb) of the bismuth content relative to the antimony content is 0.03 or more and 0.7 or less.

It is preferable that in the solder alloy, relative to the total amount of the solder alloy, the copper content is 0.1 mass % or more and 1 mass % or less, the nickel content is 0.01 mass % or more and 0.2 mass % or less, and the mass ratio (Cu/Ni) of the copper content relative to the nickel content is less than 12.5.

It is preferable that the solder alloy further contains cobalt, and the cobalt content relative to the total amount of the solder alloy is 0.001 mass % or more and 0.01 mass % or less.

A solder paste in another aspect of the present invention contains a flux and a solder powder composed of the above-described solder alloy.

An electronic circuit board in still another aspect of the present invention includes a soldered portion soldered by the above-described solder paste.

Effect of the Invention

A solder alloy in an aspect of the present invention has a silver content of more than 1.0 mass % and less than 1.2 mass %, which is low, and low costs can be achieved.

The above-described solder alloy contains tin, silver, antimony, bismuth, copper, and nickel, but substantially contains no germanium, which is easily oxidized, and has an antimony content of 0.01 mass % or more and 10 mass % or less, and a bismuth content of 0.01 mass % or more and 3.0 mass % or less. Thus, formation of oxides in the solder alloy can be suppressed, and in this manner, generation of voids (gaps) can be suppressed, and furthermore, fatigue resistance (particularly cold thermal fatigue) at solder joint portions can be given, and wettability of the solder can be ensured.

A solder paste in another aspect of the present invention contains the above-described solder alloy, and therefore low costs can be achieved, excellent wettability can be ensured, and furthermore, generation of voids (gaps) can be suppressed.

In an electronic circuit board of still another aspect of the present invention, the above-described solder paste is used in soldering, and therefore low costs can be achieved, and at the same time excellent connection reliability can be ensured.

EMBODIMENT OF THE INVENTION

A solder alloy in an aspect of the present invention is a tin-silver-copper solder alloy, contains substantially no germanium, and contains tin, silver, antimony, bismuth, copper, and nickel as essential components.

"Contains substantially no germanium" means that germanium is positively not blended, and allows for a germanium content as an impurity that is unavoidably mixed.

In such a solder alloy, the tin content is a remaining percentage deducting the percentage for the other components to be described later from the whole, and is suitably set in accordance with the amounts of the components blended.

The silver content relative to the total amount of the solder alloy is more than 1.0 mass %, preferably 1.02 mass % or more and less than 1.2 mass %, and preferably 1.18 mass % or less.

In the above-described solder alloy, the silver content is set within the above-described range, and therefore low costs can be achieved. Furthermore, because the metal contents for other metals are set within the range to be described later, even if the silver content in the solder alloy is set to be low as described above, excellent bonding strength, wettability, impact resistance, and fatigue resistance can be ensured. Furthermore, by setting the silver content low as described above, effects of copper to be described later (erosion resistance) can be brought out effectively.

When the silver content is the above-described lower limit or less, bonding strength may be poor, and exhibition of the effects of copper to be described later (erosion resistance) may tend to be hindered. Meanwhile, when the silver content is the above-described upper limit or more, effects of costs reduction of solder alloy may not be easily achieved. In addition, when cobalt described later is blended, the effects of cobalt (impact resistance, fatigue resistance) are hindered from being exhibited.

The antimony content relative to the total of the solder alloy is 0.01 mass % or more, preferably 0.06 mass % or more and 10 mass % or less, preferably 9.0 mass % or less, more preferably 6.5 mass % or less.

When the antimony content is within the above-described range, excellent heat resistance and bonding strength can be ensured, and furthermore, antimony forms a solid solution in tin, causing higher strength of solder alloy and improvement in fatigue resistance (particularly cold thermal fatigue). Furthermore, when used in a solder paste as described later, excellent solder wettability and fatigue resistance can be ensured, and moreover, generation of voids can be suppressed.

Meanwhile, when the antimony content is less than the above-described lower limit, bonding strength and fatigue resistance (particularly cold thermal fatigue) may be poor, and voids may easily be generated. When the antimony content is the above-described upper limit or more, there are disadvantages in that wettability, bonding strength, and fatigue resistance (particularly cold thermal fatigue) are poor, and furthermore, voids are easily generated.

The bismuth content relative to the total amount of the solder alloy is, for example, 0.01 mass % or more, preferably 0.1 mass % or more, more preferably 0.8 mass % or more, and 3.0 mass % or less, preferably 2.5 mass % or less, more preferably 2.2 mass % or less.

When the bismuth content is within the above-described range, excellent bonding strength and melting point can be ensured.

Meanwhile, when the bismuth content is less than the above-described lower limit, bonding strength may be poor, and the melting point may be too high. When the bismuth content is more than the above-described upper limit, bonding strength may be reduced.

In the solder alloy, the antimony content may be 0.01 mass % or more, preferably 0.06 mass % or more, and less than 2.5 mass %, preferably 1.5 mass % or less, more preferably 0.6 mass % or less. When the antimony content is in such a range, the total of the antimony content and the bismuth content relative to the total amount of the solder alloy is, for example, 0.1 mass % or more, preferably 0.15 mass % or more, more preferably 0.8 mass % or more, and for example, 4.2 mass % or less, preferably 2.8 mass % or less, more preferably 2.2 mass % or less.

When the antimony content is set in the above-described range, and when the total of the antimony content and the bismuth content is within the above-described range, excellent bonding strength is ensured.

Meanwhile, when the total of the antimony content and the bismuth content is less than the above-described lower limit, bonding strength may be poor. Furthermore, when the total of the antimony content and the bismuth content is more than the above-described upper limit, bonding strength may be reduced.

When the antimony content is set in the above-described range, mass ratio (Bi/Sb) of the bismuth content to the antimony content is, for example, 0.5 or more, preferably 1 or more, more preferably 10 or more, and for example, 300 or less, preferably 60 or less, more preferably 50 or less, even more preferably 35 or less, particularly preferably 30 or less.

When the mass ratio (Bi/Sb) of bismuth to antimony is in the above-described range, excellent bonding strength can be ensured.

Meanwhile, when the mass ratio (Bi/Sb) of bismuth to antimony is less than the above-described lower limit, bonding strength and wettability may be poor, and voids may be generated easily. When the mass ratio (Bi/Sb) of bismuth to antimony is more than the above-described upper limit as well, bonding strength may be poor.

Meanwhile, in the solder alloy, the antimony content can also be, for example, 4.0 mass % or more, preferably 4.2 mass % or more, more preferably 4.8 mass % or more, and 10 mass % or less, preferably 9.5 mass % or less, more preferably 9.0 mass % or less. When the antimony content is in the above range, the total of the antimony content and the bismuth content relative to the total amount of the solder alloy is, for example, 4.2 mass % or more, preferably 4.5 mass % or more, more preferably 5.0 mass % or more, and for example, 12 mass % or less, preferably 11 mass % or less, more preferably 10.5 mass % or less.

When the antimony content is set in the above-described range, and when the total of the antimony content and the bismuth content is in the above-described range, excellent bonding strength can be ensured.

Meanwhile, when the total of the antimony content and the bismuth content is less than the above-described lower limit, bonding strength may be poor. When the total of the antimony content and the bismuth content is more than the above-described upper limit, bonding strength may be reduced.

When the antimony content is set in the above-described range, mass ratio (Bi/Sb) of the bismuth content to the antimony content is, for example, 0.02 or more, preferably 0.03 or more, more preferably 0.05 or more, and for example, 3.0 or less, preferably 1.5 or less, more preferably 0.7 or less, even more preferably 0.6 or less.

When the mass ratio (Bi/Sb) of bismuth to antimony is in the above-described range, excellent bonding strength can be ensured.

Meanwhile, when the mass ratio (Bi/Sb) of bismuth to antimony is less than the above-described lower limit, bonding strength and wettability may be poor, and voids may be generated easily. When the mass ratio (Bi/Sb) of bismuth to antimony is more than the above-described upper limit, bonding strength may be poor.

The copper content relative to the total amount of the solder alloy is, for example, 0.1 mass % or more, preferably 0.3 mass % or more, more preferably 0.5 mass % or more, and for example, 1.5 mass % or less, preferably 1 mass % or less, more preferably 0.8 mass % or less.

When the copper content is in the above-described range, excellent erosion resistance and bonding strength can be ensured.

Meanwhile, when the copper content is less than the above-described lower limit, erosion resistance may be poor. When the copper content is more than the above-described upper limit, fatigue resistance (particularly cold thermal fatigue) may be poor, and bonding strength may be poor.

The nickel content relative to the total amount of the solder alloy is, for example, 0.01 mass % or more, preferably 0.03 mass % or more, and for example, 1 mass % or less, preferably 0.2 mass % or less, more preferably 0.1 mass % or less.

When the nickel content is in the above-described range, the crystal structure can be a fine-grained structure, and strength and fatigue resistance (particularly cold thermal fatigue) can be improved.

Meanwhile, when the nickel content is less than the above-described lower limit, strength and fatigue resistance (particularly cold thermal fatigue) may be poor. When the nickel content is more than the above-described upper limit as well, strength and fatigue resistance (particularly cold thermal fatigue) may be poor.

The mass ratio (Cu/Ni) of copper content to nickel content is, for example, less than 25, preferably less than 12.5, more preferably 12 or less, and usually 5 or more.

When the mass ratio (Cu/Ni) of copper to nickel is in the above-described range, excellent bonding strength can be ensured.

Meanwhile, when the mass ratio (Cu/Ni) of copper to nickel is less than the above-described lower limit, bonding strength may be poor. When the mass ratio (Cu/Ni) of copper to nickel is the above-described upper limit or more as well, bonding strength may be poor.

The above-described solder alloy may further contain cobalt as an optional component.

When the solder alloy contains cobalt, in a solder paste produced from the solder alloy, an intermetallic compound layer (e.g., Sn—Cu, Sn—Co, Sn—Cu—Co, etc.) formed at soldered interface may become thick, and it may be difficult to grow even with thermal burden and burden due to thermal changes. The solder may be reinforced by dispersing and depositing cobalt in the solder. Thus, when the solder alloy contains cobalt, excellent fatigue resistance and bonding strength may be ensured.

The cobalt content relative to the total amount of the solder alloy is, for example, 0.001 mass % or more, preferably 0.002 mass % or more, and for example, 0.01 mass % or less, preferably 0.005 mass % or less, more preferably 0.004 mass % or less.

When the cobalt content is in the above-described range, improvement in bonding strength can be achieved.

Meanwhile, when the cobalt content is less than the above-described lower limit, fatigue resistance may be poor, and improvement in bonding strength may not be achieved. When the cobalt content is more than the above-described upper limit, the intermetallic compound layer becomes thick, and hardness becomes high and tenacity decreases, and therefore fatigue resistance may be poor, and improvement in bonding strength may not be achieved.

The above-described solder alloy may further contain indium as an optional component.

The indium content relative to the total amount of the solder alloy is, for example, 0.01 mass % or more, preferably 0.03 mass % or more, and for example, 0.1 mass % or less, preferably 0.08 mass % or less.

When the indium content is in the above-described range, excellent bonding strength can be ensured.

Meanwhile, when the indium content is less than the above-described lower limit, bonding strength may be poor. When the indium content is more than the above-described upper limit, wettability may be poor, and voids generation may easily be caused.

Such a solder alloy can be produced by alloying with a known method, for example, by melting the above-described metal components in a melting furnace, and homogenizing the mixture.

The metal components are not particularly limited, and in view of homogeneously melting the metal components, preferably, powder state metals are used.

The average particle size of the metal powder is not particularly limited, and is, for example, 5 to 50 μm measured by using a particle size•particle size distribution analyzer by laser diffraction method.

The metal powder used in production of the solder alloy may contain a trace amount of impurities (unavoidable impurity) to the extent that does not hinder excellent effects of the present invention.

The thus obtained solder alloy has a melting point measured by DSC method (measurement conditions: temperature increase speed 0.5° C./min) of, for example, 200° C. or more, preferably 220° C. or more, and for example, 250° C. or less, preferably 240° C. or less.

When the solder alloy has a melting point in the above-described range, when used for the solder paste, metals can be joined with excellent ease and workability.

The above-described solder alloy has a silver content of more than 1.0 mass % and less than 1.2 mass %, and this achieves low costs.

The above-described solder alloy contains tin, silver, antimony, bismuth, copper, and nickel, but substantially does not contain easy-to-be-oxidized germanium, and has an antimony content of 0.01 mass % or more and 10 mass % or less, and a bismuth content of 0.01 mass % or more and 3.0 mass % or less. Thus, oxide formation in the solder alloy can be suppressed, and this allows for suppression of voids (gaps) generation, and furthermore, fatigue resistance (particularly cold thermal fatigue) at the solder joining portion can be given, and wettability of the solder can be ensured.

That is, even if the antimony content is less than 0.01 mass %, or more than 10 mass %, for example, when the bismuth content is less than 0.01 mass %, or more than 3.0 mass %, even if germanium is substantially not contained, wettability may be poor, and voids generation may easily be caused.

However, when the antimony content is 0.01 mass % or more and 10 mass % or less, and the bismuth content is 0.01 mass % or more and 3.0 mass % or less, and when germanium is substantially not contained, particularly excellent wettability can be ensured, and furthermore, voids (gaps) generation can be suppressed.

Thus, such a solder alloy is preferably contained in a solder paste (solder paste bonding material).

To be specific, in another aspect of the present invention, the solder paste contains the above-described solder alloy, and a flux.

In the solder paste, the solder alloy is contained preferably as a powder.

The powder shape is not particularly limited, and for example, the powder shape can be substantially complete spherical, for example, flat block, and for example, acicular, and can also be amorphous. The powder shape is set suitably in accordance with the characteristics required for the solder paste (e.g., thixotropy, sagging resistance, etc.).

The average particle size (when spherical) or the average longitudinal direction length (when not spherical) of the solder alloy powder is, for example, 5 to 50 µm, measured by laser diffraction method with a particle size•particle size distribution analyzer.

The flux is not particularly limited, and a known solder flux may be used.

To be specific, the flux is mainly composed of, for example, base resin (rosin, acrylic resin, etc.), an activator (e.g., hydrohalic acid salt of amities such as ethylamine and propylamine, and organic carboxylic acids such as, for example, lactic acid, citric acid, benzoic acid, etc.), and a thixotropic agent (hydrogenated castor oil, beeswax, carnauba wax, etc.), and when the flux is used in a liquid state, an organic solvent may further be contained.

The solder paste can be produced by mixing the above-described powder composed of the solder alloy, and the above-described flux by a known method.

The mixing ratio (solder alloy:flux (mass ratio)) of the solder alloy (powder) to the flux is, for example, 70:30 to 90:10.

The above-described solder paste contains the solder alloy in an aspect of the present invention, and therefore low costs can be achieved, and at the same time, excellent wettability can be ensured, and furthermore, voids (gaps) generation can be suppressed.

The present invention includes an electronic circuit board including a soldered portion soldered by the above-described solder paste.

That is, the above-described solder paste is suitably used in, for example, soldering (metal joining) of electrodes in electronic circuit boards of electrical and electronic devices to an electronic component.

The electronic component is not particularly limited, and includes a known electronic component such as, for example, resistor, diode, condenser, and transistor.

In the electronic circuit board, in soldering, the above-described solder paste is used, and therefore low costs can be achieved, and excellent connection reliability can be ensured.

The above-described method for using a solder alloy is not limited to the above-described solder paste, and for example, can be used for production of flux-cored solder materials. To be specific, for example, a flux-cored solder material can also be produced by a known method (e.g., extrusion molding, etc.), by molding the above-described solder alloy into a line with the above-described flux as the core.

The flux-cored solder material as well can be suitably used in, as the solder paste, for example, soldering (metal joining) of an electronic circuit board such as electrical and electronic devices.

EXAMPLES

The present invention is described below based on Examples and Comparative Examples, but the present invention is not limited to Examples below.

Examples 1 to 36 and Comparative Examples 1 to 7

Preparation of Solder Alloy

Powder of the metals shown in Tables 1 to 3 were mixed at the mixing ratio shown in Tables 1 to 3, and the produced mixture of metals was melted in a melting furnace and was homogenized, thereby preparing a solder alloy. In the mixing formulation of solder alloys shown in Tables 1 to 3, tin (Sn) is not shown. The mixing ratio of Sn in the mixing formulation of Examples and Comparative Examples is the remainder deducting the mixing ratio (mass %) of the metals (silver (Ag), copper (Cu), bismuth (Bi), antimony (Sb), nickel (Ni), indium (In), cobalt (Co), and germanium (Ge)) shown in Tables 1 to 3 from the whole.

In the solder alloy of Example 1, the metals of Ag, Cu, Bi, Sb, and Ni were blended at the ratio shown in Table 1, and for the remaining percentage, Sn was used. In Examples 2 to 4, In and/or Co were further added to the formulation of Example 1.

In Examples 5 to 10, a solder alloy was produced based on the formulation of Example 1, except that the mixing ratio of Bi was changed.

In Examples 11 to 13, a solder alloy was produced based on the formulation of Example 6, except that the mixing ratio of Sb, and the mass ratio (Bi/Sb) of Bi to Sb blended were changed.

In Example 14, a solder alloy was produced based on the formulation of Example 1, except that the mixing ratio of Cu was changed.

In Examples 15 to 22, a solder alloy was produced based on Examples 6 to 9 and 11 to 14, except that Co was further added.

In Examples 23 to 26, 35, and Comparative Example 2, a solder alloy was produced based on the formulation of Example 1, except that the mixing ratio of Sb, and mass ratio (Bi/Sb) of Bi to Sb blended were changed.

In Examples 27 and 28, a solder alloy was produced based on the formulation of Example 1, except that the mixing ratio of Ag was changed.

In Examples 29 to 32, the metals of Ag, Cu, Bi, Sb, Ni, and Co were blended at a ratio shown in Table 3, and for the remaining percentage, Sn was used.

In Examples 33 to 36, a solder alloy was produced based on the formulation of Example 1, except that the mixing ratios of Bi and Sb were changed.

In Comparative Example 1, a solder alloy was produced based on the formulation of Example 1, except that Ge was further added.

In Comparative Example 3, a solder alloy was produced based on the formulation of Example 1, except that Sb was not blended.

In Comparative Example 4, the formulation represented by Sn96.5-Ag3.0-Cu0.5, a standard composition for Sn—Ag—Cu solders, was used.

In Comparative Examples 5 to 7, a solder alloy was produced based on the formulation of Comparative Example 4, except that the mixing ratio of Ag was changed.

Preparation of Solder Paste

The produced solder alloy was made into a powder with a particle size of 25 to 38 µm, and the produced solder alloy powder and a known flux were mixed, thereby producing a solder paste.

Evaluation on Solder Paste

The produced solder paste was printed on a printed circuit board for mounting chip components, and chip components were mounted by reflowing. The printing conditions for the solder paste at the time of mounting, and the size of the chip components were set suitably in accordance with evaluation described later for "bonding strength•bonding durability", "solder wettability", and "voids generation".

TABLE 1

| No. | Mixing formulation (mass %) | | | | | | | Bi/Sb (mass ratio) | Cu/Ni (mass ratio) |
|---|---|---|---|---|---|---|---|---|---|
| | Ag | Cu | Bi | Sb | Ni | In | Co | Ge | | |
| Example 1 | 1.1 | 0.7 | 1.7 | 0.08<br>1.78 | 0.065 | — | — | — | 21.25 | 10.77 |
| Example 2 | 1.1 | 0.7 | 1.7 | 0.08<br>1.78 | 0.065 | 0.05 | — | — | 21.25 | 10.77 |
| Example 3 | 1.1 | 0.7 | 1.7 | 0.08<br>1.78 | 0.065 | 0.05 | 0.003 | — | 21.25 | 10.77 |
| Example 4 | 1.1 | 0.7 | 1.7 | 0.08<br>1.78 | 0.065 | — | 0.003 | — | 21.25 | 10.77 |
| Example 5 | 1.1 | 0.7 | 3.0 | 0.08<br>3.08 | 0.065 | — | — | — | 37.5 | 10.77 |
| Example 6 | 1.1 | 0.7 | 2.5 | 0.08<br>2.58 | 0.065 | — | — | — | 31.25 | 10.77 |
| Example 7 | 1.1 | 0.7 | 2.0 | 0.08<br>2.08 | 0.065 | — | — | — | 25 | 10.77 |
| Example 8 | 1.1 | 0.7 | 1.0 | 0.08<br>1.08 | 0.065 | — | — | — | 12.5 | 10.77 |
| Example 9 | 1.1 | 0.7 | 0.1 | 0.08<br>0.18 | 0.065 | — | — | — | 1.25 | 10.77 |
| Example 10 | 1.1 | 0.7 | 0.05 | 0.08<br>0.13 | 0.065 | — | — | — | 0.625 | 10.77 |
| Example 11 | 1.1 | 0.7 | 2.5 | 0.01<br>2.51 | 0.065 | — | — | — | 250 | 10.77 |
| Example 12 | 1.1 | 0.7 | 2.5 | 0.05<br>2.55 | 0.065 | — | — | — | 50 | 10.77 |
| Example 13 | 1.1 | 0.7 | 2.5 | 1.5<br>4.0 | 0.065 | — | — | — | 1.667 | 10.77 |
| Example 14 | 1.1 | 1.5 | 1.7 | 0.08<br>1.78 | 0.065 | — | — | — | 21.25 | 23.08 |

TABLE 2

| No. | Mixing formulation (mass %) | | | | | | | Bi/Sb (mass ratio) | Cu/Ni (mass ratio) |
|---|---|---|---|---|---|---|---|---|---|
| | Ag | Cu | Bi | Sb | Ni | In | Co | Ge | | |
| Example 15 | 1.1 | 0.7 | 2.5 | 0.08<br>2.58 | 0.065 | — | 0.003 | — | 31.25 | 10.77 |
| Example 16 | 1.1 | 0.7 | 2.0 | 0.08<br>2.08 | 0.065 | — | 0.003 | — | 25 | 10.77 |
| Example 17 | 1.1 | 0.7 | 1.0 | 0.08<br>1.08 | 0.065 | — | 0.003 | — | 12.5 | 10.77 |
| Example 18 | 1.1 | 0.7 | 0.1 | 0.08<br>0.18 | 0.065 | — | 0.003 | — | 1.25 | 10.77 |
| Example 19 | 1.1 | 0.7 | 2.5 | 0.01<br>2.51 | 0.065 | — | 0.003 | — | 250 | 10.77 |
| Example 20 | 1.1 | 0.7 | 2.5 | 0.05<br>2.55 | 0.065 | — | 0.003 | — | 50 | 10.77 |
| Example 21 | 1.1 | 0.7 | 2.5 | 1.5<br>4.0 | 0.065 | — | 0.003 | — | 1.667 | 10.77 |
| Example 22 | 1.1 | 1.5 | 1.7 | 0.08<br>1.78 | 0.065 | — | 0.003 | — | 21.25 | 23.08 |
| Example 23 | 1.1 | 0.7 | 1.7 | 0.01<br>1.71 | 0.065 | — | — | — | 170 | 10.77 |
| Example 24 | 1.1 | 0.7 | 1.7 | 0.06<br>1.76 | 0.065 | — | — | — | 28.33 | 10.77 |
| Example 25 | 1.1 | 0.7 | 1.7 | 0.52<br>2.22 | 0.065 | — | — | — | 3.27 | 10.77 |
| Example 26 | 1.1 | 0.7 | 1.7 | 2.4<br>4.1 | 0.065 | — | — | — | 0.708 | 10.77 |
| Example 27 | 1.05 | 0.7 | 1.7 | 0.08<br>1.78 | 0.065 | — | — | — | 21.25 | 10.77 |
| Example 28 | 1.15 | 0.7 | 1.7 | 0.08<br>1.78 | 0.065 | — | — | — | 21.25 | 10.77 |

TABLE 3

| No. | Mixing formulation (mass %) | | | | | | | Bi/Sb (mass ratio) | Cu/Ni (mass ratio) |
|---|---|---|---|---|---|---|---|---|---|
| | Ag | Cu | Bi | Sb | Ni | In | Co | Ge | | |
| Example 29 | 1.1 | 0.6 | 1.50 | 6.50 / 8.00 | 0.05 | — | 0.005 | — | 0.231 | 12.00 |
| Example 30 | 1.1 | 0.6 | 1.50 | 9.00 / 10.50 | 0.05 | — | 0.005 | — | 0.167 | 12.00 |
| Example 31 | 1.1 | 0.6 | 0.30 | 5.00 / 5.30 | 0.05 | — | 0.005 | — | 0.060 | 12.00 |
| Example 32 | 1.1 | 0.6 | 2.80 | 5.00 / 7.80 | 0.05 | — | 0.005 | — | 0.560 | 12.00 |
| Example 33 | 1.1 | 0.7 | 3.00 | 2.00 / 5.00 | 0.065 | — | — | — | 1.500 | 10.77 |
| Example 34 | 1.1 | 0.7 | 1.70 | 2.50 / 4.20 | 0.065 | — | — | — | 0.680 | 10.77 |
| Example 35 | 1.1 | 0.7 | 3.00 | 10.00 / 13.00 | 0.065 | — | — | — | 0.300 | 10.77 |
| Example 36 | 1.1 | 0.7 | 0.10 | 4.00 / 4.10 | 0.065 | — | — | — | 0.025 | 10.77 |
| Comparative Example 1 | 1.1 | 0.7 | 1.70 | 0.08 / 1.78 | 0.065 | — | — | 0.005 | 21.25 | 10.77 |
| Comparative Example 2 | 1.1 | 0.7 | 1.70 | 11.00 / 12.70 | 0.065 | — | — | — | 0.154 | 10.77 |
| Comparative Example 3 | 1.1 | 0.7 | 1.70 | — / 1.70 | 0.065 | — | — | — | — | 10.77 |
| Comparative Example 4 | 3.0 | 0.5 | — | — | — | — | — | — | — | — |
| Comparative Example 5 | 1.5 | 0.7 | — | — | — | — | — | — | — | — |
| Comparative Example 6 | 1.1 | 0.7 | — | — | — | — | — | — | — | — |
| Comparative Example 7 | 0.8 | 0.7 | — | — | — | — | — | — | — | — |

Evaluation

The solder paste produced in Examples and Comparative Examples was evaluated as shown below. The results are shown in Tables 4 and 5.

<Bonding Strength>

Initial Bonding Strength

The solder paste produced in Examples and Comparative Examples was printed on a printed circuit board for mounting chip components, and chip components were mounted by reflowing. The thickness of the printed solder paste was adjusted by using a metal mask with a thickness of 150 μm. After the printing of the solder paste, chip components of 3216 size (32 mm×16 mm) were mounted on predetermined positions of the above-described printed circuit board, and subjected to reflowing. The peak temperature for reflowing was set to 240° C.

Using the printed circuit board on which the chip components were mounted as a test circuit board, bonding strength at the chip components was measured by using a bond tester (Manufactured by DAGE Japan Co. Ltd.). The shear velocity for the chip component at the time of measurement was set to 100 μm/sec, and the bonding strength was measured based on the average value for a total of 30 test circuit boards.

The initial bonding strength was evaluated relatively based on the criteria below setting the bonding strength of the chip components when using the solder paste (solder alloy composition Sn96.5-Ag3.0-Cu0.5, (hereinafter referred to as "SAC305") of Comparative Example 4 as a benchmark.

A+: showing a value larger by 30% or more relative to the initial bonding strength of Comparative Example 4, initial bonding strength was extremely good.

A: showing a value larger by 10% or more relative to the initial bonding strength of Comparative Example 4, initial bonding strength was good.

B: difference from the initial bonding strength of Comparative Example 4 was less than 5% and more than −5%.

C: showing a value smaller by 5% or more relative to the initial bonding strength of Comparative Example 4, initial bonding strength was insufficient.

Bonding Durability (Cold Thermal Fatigue)

The same test circuit boards as those used for the measurement of initial bonding strength were subjected to hot and cold cycle test. In hot and cold cycle test, the test circuit boards were placed in a hot and cold cycle tank, and then a cycle of the following was repeated to 1500 cycles: the test circuit boards were held under an environment of −40° C. for 30 minutes, and then held under an environment of 125° C. for 30 minutes. The bonding strength after 1500 cycles (after endurance test) of the chip components was measured in the same manner as in the measurement of initial bonding strength, and an average value for a total of 30 test circuit boards was obtained.

The bonding durability (cold thermal fatigue) was evaluated relatively based on the criteria below using the bonding strength of chip component after being subjected to the 1500 cycles in hot and cold cycle test with the solder paste of Comparative Example 4.

A+: showing a value larger by 30% or more relative to bonding strength (after endurance test) of Comparative Example 4, cold thermal fatigue was extremely good.

A: showing a value larger by 10% or more relative to the bonding strength (after endurance test) of Comparative Example 4, cold thermal fatigue was excellent.

B: difference from the bonding strength (after endurance test) of Comparative Example 4 was less than 5% and more than −5%.

C: showing a value smaller by 5% or more relative to the bonding strength (after endurance test) of Comparative Example 4, cold thermal fatigue was insufficient.

<Solder Wettability>

The solder paste produced in Examples and Comparative Examples was printed on a printed circuit board for mounting chip components, and then the printed circuit board was heated under the same conditions for mounting the chip components by reflowing, thereby melting the solder alloy in the solder paste. For the printed circuit board, those printed circuit boards for mounting chip components with 0603 size (6 mm×3 mm) were used. The thickness of the printed solder paste was adjusted by using a metal mask with a thickness of 120 μm. The peak temperature for reflowing was set to 240° C.

After cooling the printed circuit board, the melting status of the solder on the printed circuit board was observed with an optical microscope, and melting characteristics of the solder (i.e., "solder wettability") were evaluated based on the following criteria. The solder paste was printed at 20 positions in total per one printed circuit board, and solder wettability was evaluated by observing all of the printed positions in the printed circuit board.

A: solder was completely melted, and solder wettability was excellent.

B: some solder drops of the solder alloy that did not melt and remained were observed.

C: significant portion of the solder alloy did not melt and remained, and solder wettability was insufficient.

<Effects of Voids Generation Suppression>

The solder paste produced in Examples and Comparative Examples was printed on a printed circuit board for mounting chip components, and thereafter the printed circuit board was heated under the same conditions for mounting the chip components by reflowing, thereby melting the solder alloy in the solder paste. For the printed circuit board, those printed circuit boards for mounting chip components with 2125 size (21 mm×25 mm) were used. The thickness of the printed solder paste was adjusted by using a metal mask with a thickness of 120 μm. The peak temperature for reflowing was set to 240° C.

After cooling the printed circuit board, the surface conditions of the solder on the printed circuit board were observed with X-ray photographs, and a percentage of the total area of voids in the region where solder is formed (percentage of voids area) was measured. Status of voids generation was evaluated based on the following criteria by determining an average value for the percentage of voids area for 30 lands in the printed circuit board.

A+: average value for the percentage of voids area was 1% or less, and effects of voids generation suppression was extremely good.

A: average value for the percentage of voids area was more than 1% and 3% or less, and effects of voids generation suppression was excellent.

B: average value for the percentage of voids area was more than 3% and 5% or less.

C: average value for the percentage of voids area was more than 5% and effects of voids generation suppression were insufficient.

<Overall Evaluation>

Score Calculation and Overall Evaluation

The score total was calculated, setting grade "A+" as 4 points, grade "A" as 3 points, grade "B" as 2 points, and grade "C" as 1 point in the evaluation for the above-described "initial bonding strength", "bonding durability", "wettability", and "voids generation". Then, based on the total score, the solder paste of Examples and Comparative Examples was comprehensively evaluated based on the criteria below.

A+: extremely good (score of 14 points or more)

A: good (score of 12 to 13 points. With no grade "B" or lower in evaluation category)

A-: good for the most part (score of 11 points or more. With grade of "B" but no grade of "C" in evaluation category)

B: practically acceptable (score of 8 to 10 points. With grade of "B" but no grade of "C" in evaluation category)

C: not good (with grade of "C" in at least one evaluation category)

TABLE 4

| | Evaluation | | | | | |
|---|---|---|---|---|---|---|
| No. | Initial bonding strength | Bonding durability | Wetta-bility | Void generation status | Total points | Evaluation results |
| Example 1 | A+ | A+ | A | A+ | 15 | A+ |
| Example 2 | A+ | A+ | A | A+ | 15 | A+ |
| Example 3 | A+ | A+ | A | A+ | 15 | A+ |
| Example 4 | A+ | A+ | A | A+ | 15 | A+ |
| Example 5 | A | B | A | A | 11 | A- |
| Example 6 | A | A | A | A | 12 | A |
| Example 7 | A+ | A+ | A | A+ | 15 | A+ |
| Example 8 | A+ | A+ | A | A+ | 15 | A+ |
| Example 9 | B | A | A | A | 11 | A- |
| Example 10 | B | B | A | A | 10 | B |
| Example 11 | A | B | A | A | 11 | A- |
| Example 12 | A | B | A | A | 11 | A- |
| Example 13 | A | A | B | B | 10 | B |
| Example 14 | A | B | A | A | 11 | A- |
| Example 15 | A | A | A | A | 12 | A |
| Example 16 | A+ | A+ | A | A+ | 15 | A+ |
| Example 17 | A+ | A+ | A | A+ | 15 | A+ |
| Example 18 | A | A | A | A | 12 | A |
| Example 19 | A | B | A | A | 11 | A- |
| Example 20 | A | B | A | A | 11 | A- |
| Example 21 | A | A | B | B | 10 | B |
| Example 22 | B | B | A | A | 10 | B |
| Example 23 | A | A | A | A+ | 13 | A+ |
| Example 24 | A+ | A+ | A | A+ | 15 | A+ |
| Example 25 | A+ | A+ | A | A+ | 15 | A+ |
| Example 26 | A+ | A+ | B | B | 12 | A- |
| Example 27 | A+ | A+ | A | A+ | 15 | A+ |
| Example 28 | A+ | A+ | A | A+ | 15 | A+ |

TABLE 5

| | Evaluation | | | | | |
|---|---|---|---|---|---|---|
| No. | Initial bonding strength | Bonding durability | Wetta-bility | Void generation status | Total points | Evaluation results |
| Example 29 | A+ | A+ | A | A | 14 | A+ |
| Example 30 | A+ | A+ | A | A | 14 | A+ |
| Example 31 | A+ | A+ | A | A | 14 | A+ |
| Example 32 | A+ | A+ | A | A | 14 | A+ |

TABLE 5-continued

| No. | Initial bonding strength | Bonding durability | Wet-ta-bility | Void generation status | Total points | Evaluation results |
|---|---|---|---|---|---|---|
| Example 33 | A | A | B | B | 10 | B |
| Example 34 | A | B | B | B | 9 | B |
| Example 35 | A | A | B | B | 10 | B |
| Example 36 | B | B | A | A | 10 | B |
| Comparative Example 1 | A+ | A | C | C | 9 | C |
| Comparative Example 2 | A | A | C | C | 8 | C |
| Comparative Example 3 | B | C | A | A | 9 | C |
| Comparative Example 4 | B | C | A | A | 9 | C |
| Comparative Example 5 | C | C | A | A | 8 | C |
| Comparative Example 6 | C | C | A | A | 8 | C |
| Comparative Example 7 | C | C | A | A | 8 | C |

<Production of Electronic Circuit Board>

In the above-described Examples and Comparative Examples, chip components of various sizes, for example, 3216 size (32 mm×16 mm), 0603 size (6 mm×3 mm), and 2125 size (21 mm×25 mm), were mounted for evaluation of solder pastes, and for example, bonding strength of soldered portion was evaluated. As is clear from the aforementioned evaluation results, with use of the solder paste of the aforementioned Examples, good results were obtained in any of the "initial bonding strength", "bonding durability", "solder wettability", and "effects of voids generation suppression".

That is, with use of the solder paste of the aforementioned Examples, electronic circuit boards compatible for chip components of various sizes, and are excellent in connection reliability of chip components were produced.

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

The solder alloy and solder paste of the present invention are used in electronic circuit boards used for electrical and electronic devices.

The invention claimed is:

1. A tin-silver-copper solder alloy consisting of:
tin, silver, antimony, bismuth, copper, and nickel, and comprising no germanium except for a trace amount thereof contained as an unavoidable impurity,
wherein relative to the total amount of the solder alloy,
the silver content is more than 1.0 mass % and less than 1.2 mass %,
the antimony content is 0.01 mass % or more and 10 mass % or less,
the bismuth content is 0.01 mass % or more and 3.0 mass % or less,
the copper content is 0.1 mass % or more and 1 mass % or less,
the nickel content is 0.01 mass % or more and 0.2 mass % or less,
the tin content is the remaining content, and
a mass ratio of the copper content to the nickel content (Cu/Ni) is less than 12.5.

2. The solder alloy according to claim 1, wherein relative to the total amount of the solder alloy,
the antimony content is 0.01 mass % or more and less than 2.5 mass %, and
the total of the antimony content and the bismuth content relative to the total amount of the solder alloy is 0.1 mass % or more and 4.2 mass % or less.

3. The solder alloy according to claim 2, wherein the mass ratio (Bi/Sb) of the bismuth content relative to the antimony content is 0.5 or more and 300 or less.

4. The solder alloy according to claim 1, further comprising indium,
wherein the indium content relative to the total amount of the solder alloy is 0.01 mass % or more and 0.1 mass % or less.

5. The solder alloy according to claim 1 comprising no indium except for a trace amount thereof contained as an unavoidable impurity,
wherein relative to the total amount of the solder alloy,
the antimony content is 4.0 mass % or more and 10 mass % or less, and
the total of the antimony content and the bismuth content relative to the total amount of the solder alloy is 4.2 mass % or more and 12 mass % or less.

6. The solder alloy according to claim 5, wherein the mass ratio (Bi/Sb) of the bismuth content relative to the antimony content is 0.03 or more and 0.7 or less.

7. The solder alloy according to claim 1, further comprising cobalt,
wherein the cobalt content relative to the total amount of the solder alloy is 0.001 mass % or more and 0.005 mass % or less.

8. A solder paste comprising a flux, and a solder powder composed of a solder alloy,
wherein the solder alloy is a tin-silver-copper solder alloy consisting of tin, silver, antimony, bismuth, copper, and nickel, and comprising no germanium except for a trace amount thereof contained as an unavoidable impurity, and
relative to the total amount of the solder alloy,
the silver content is more than 1.0 mass % and less than 1.2 mass %,
the antimony content is 0.01 mass % or more and 10 mass % or less,
the bismuth content is 0.01 mass % or more and 3.0 mass % or less,
the copper content is 0.1 mass % or more and 1 mass % or less,
the nickel content is 0.01 mass % or more and 0.2 mass % or less,
the tin content is the remaining content, and
a mass ratio of the copper content to the nickel content (Cu/Ni) is less than 12.5.

9. An electronic circuit board comprising a soldered portion soldered by a solder paste, wherein
the solder paste comprises a flux, and a solder powder composed of a solder alloy,
the solder alloy is a tin-silver-copper solder alloy,
consisting of tin, silver, antimony, bismuth, copper, and nickel, and comprising no germanium except for a trace amount thereof contained as an unavoidable impurity, and
relative to the total amount of the solder alloy,
the silver content is more than 1.0 mass % and less than 1.2 mass %, the antimony content is 0.01 mass % or more and 10 mass % or less, the bismuth content is 0.01 mass % or more and 3.0 mass % or less, the copper content is 0.1 mass % or more and 1 mass % or less, the nickel content is 0.01 mass % or more and 0.2 mass % or less, the tin content is the remaining content, and a mass ratio of the copper content to the nickel content (Cu/Ni) is less than 12.5.

10. The solder alloy according to claim 1, further comprising indium, wherein the indium content relative to the total amount of the solder alloy is 0.01 mass % or more and 0.1 mass % or less, and further comprising cobalt, wherein the cobalt content relative to the total amount of the solder alloy is 0.001 mass % or more and 0.005 mass % or less.

11. The solder alloy according to claim 1, comprising no indium except for a trace amount thereof contained as an unavoidable impurity, wherein relative to the total amount of the solder alloy, the antimony content is 4.0 mass % or more and 10 mass % or less, the total of the antimony content and the bismuth content relative to the total amount of the solder alloy is 4.2 mass % or more and 12 mass % or less, the solder alloy further comprises cobalt, and the cobalt content relative to the total amount of the solder alloy is 0.001 mass % or more and 0.005 mass % or less.

12. The solder paste according to claim 8, wherein the solder alloy further comprises indium, the indium content relative to the total amount of the solder alloy is 0.01 mass % or more and 0.1 mass % or less.

13. The solder paste according to claim 8, wherein the solder alloy comprises no indium except for a trace amount thereof contained as an unavoidable impurity, relative to the total amount of the solder alloy, the antimony content is 4.0 mass % or more and 10 mass % or less, and the total of the antimony content and the bismuth content relative to the total amount of the solder alloy is 4.2 mass % or more and 12 mass % or less.

14. The solder paste according to claim 8, wherein the solder alloy further comprises cobalt, and the cobalt content relative to the total amount of the solder alloy is 0.001 mass % or more and 0.005 mass % or less.

15. The solder paste according to claim 8, wherein the solder alloy further comprises indium, and the indium content relative to the total amount of the solder alloy is 0.01 mass % or more and 0.1 mass % or less; and the solder alloy further comprises cobalt, and the cobalt content relative to the total amount of the solder alloy is 0.001 mass % or more and 0.005 mass % or less.

16. The solder paste according to claim 8, wherein the solder alloy comprises no indium except for a trace amount thereof contained as an unavoidable impurity, relative to the total amount of the solder alloy, the antimony content is 4.0 mass % or more and 10 mass % or less, the total of the antimony content and the bismuth content relative to the total amount of the solder alloy is 4.2 mass % or more and 12 mass % or less, the solder alloy further comprises cobalt, and the cobalt content relative to the total amount of the solder alloy is 0.001 mass % or more and 0.005 mass % or less.

17. The electronic circuit board according to claim 9, wherein the solder alloy further comprises indium, and the indium content relative to the total amount of the solder alloy is 0.01 mass % or more and 0.1 mass % or less.

18. The electronic circuit board according to claim 9, wherein the solder alloy comprises no indium except for a trace amount thereof contained as an unavoidable impurity, relative to the total amount of the solder alloy, the antimony content is 4.0 mass % or more and 10 mass % or less, and the total of the antimony content and the bismuth content relative to the total amount of the solder alloy is 4.2 mass % or more and 12 mass % or less.

19. The electronic circuit board according to claim 9, wherein the solder alloy further comprises cobalt, and the cobalt content relative to the total amount of the solder alloy is 0.001 mass % or more and 0.005 mass % or less.

20. The electronic circuit board according to claim 9, wherein the solder alloy further comprises indium, and the indium content relative to the total amount of the solder alloy is 0.01 mass % or more and 0.1 mass % or less; and the solder alloy further comprises cobalt, and the cobalt content relative to the total amount of the solder alloy is 0.001 mass % or more and 0.005 mass % or less.

21. The electronic circuit board according to claim 9, wherein the solder alloy comprises no indium except for a trace amount thereof contained as an unavoidable impurity, relative to the total amount of the solder alloy, the antimony content is 4.0 mass % or more and 10 mass % or less, the total of the antimony content and the bismuth content relative to the total amount of the solder alloy is 4.2 mass % or more and 12 mass % or less, the solder alloy further comprises cobalt, and the cobalt content relative to the total amount of the solder alloy is 0.001 mass % or more and 0.005 mass % or less.

* * * * *